United States Patent
Cheng et al.

(10) Patent No.: US 8,084,309 B2
(45) Date of Patent: Dec. 27, 2011

(54) EXTREMELY THIN SILICON ON INSULATOR (ETSOI) COMPLEMENTARY METAL OXIDE SEMICONDUCTOR (CMOS) WITH IN-SITU DOPED SOURCE AND DRAIN REGIONS FORMED BY A SINGLE MASK

(75) Inventors: Kangguo Cheng, Albany, NY (US); Bruce B. Doris, Yorktown Heights, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 12/542,179

(22) Filed: Aug. 17, 2009

(65) Prior Publication Data
US 2011/0037125 A1 Feb. 17, 2011

(51) Int. Cl.
*H01L 21/00* (2006.01)
*H01L 21/84* (2006.01)

(52) U.S. Cl. ........ 438/163; 438/149; 438/154; 257/351; 257/377

(58) Field of Classification Search .................. 438/149, 438/154, 163; 257/351, 377, 381, 385, E27.112, 257/E21.704, E21.135
See application file for complete search history.

(56) References Cited

U.S. PATENT DOCUMENTS

| | | | |
|---|---|---|---|
| 6,084,271 A * | 7/2000 | Yu et al. | 257/351 |
| 6,399,970 B2 * | 6/2002 | Kubo et al. | 257/194 |
| 6,914,303 B2 | 7/2005 | Doris et al. | |
| 2005/0118826 A1 | 6/2005 | Boyd et al. | |

* cited by examiner

*Primary Examiner* — Theresa T Doan
(74) *Attorney, Agent, or Firm* — Scully, Scott, Murphy & Presser, P.C.; Louis J. Percello, Esq.

(57) ABSTRACT

A method of fabricating an electronic structure is provided that includes forming a first conductivity doped first semiconductor material on the SOI semiconductor layer of a substrate. The SOI semiconductor layer has a thickness of less than 10 nm. The first conductivity in-situ doped first semiconductor material is removed from a first portion of the SOI semiconductor layer, wherein a remaining portion of the first conductivity in-situ doped first semiconductor material is present on a second portion of SOI semiconductor layer. A second conductivity in-situ doped second semiconductor material is formed on the first portion of the SOI semiconductor layer, wherein a mask prohibits the second conductivity in-situ doped semiconductor material from being formed on the second portion of the SOI semiconductor layer. The dopants from the first and second conductivity in-situ doped semiconductor materials are diffused into the first semiconductor layer to form dopant regions.

17 Claims, 8 Drawing Sheets

EXTREMELY THIN SILICON ON INSULATOR (ETSOI) COMPLEMENTARY METAL OXIDE SEMICONDUCTOR (CMOS) WITH IN-SITU DOPED SOURCE AND DRAIN REGIONS FORMED BY A SINGLE MASK

BACKGROUND

The present disclosure relates generally to semiconductor integrated circuits. More particularly, the present disclosure relates to scaling of semiconductor devices, such as metal oxide semiconductor field effect transistors (MOSFETs).

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the electrical properties of the device. Additionally, all dimensions of the device must be scaled simultaneously in order to optimize the electrical performance of the device.

SUMMARY

A method of fabricating a semiconductor device is provided in which the channel of the device is present in an extremely thin silicon on insulator (ETSOI) layer, i.e., a silicon containing layer having a thickness of less than 10.0 nm. In one embodiment, the method can begin with providing a substrate including at least a first semiconductor layer overlying a dielectric layer, wherein the first semiconductor layer has a thickness of less than 10.0 nm. A first gate structure is formed directly on a first portion of the first semiconductor layer and a second gate structure is formed directly on a second portion of the first semiconductor layer. A first conductivity in-situ doped first semiconductor material is formed on exposed surfaces of the first portion of the first semiconductor layer adjacent to the first gate structure, and on exposed surfaces of the second portion of the first semiconductor layer adjacent to the second gate structure. A mask is formed atop the second portion of the first semiconductor layer leaving the first conductivity in-situ doped first semiconductor layer on the first portion of the first semiconductor layer exposed. The first conductivity in-situ doped first semiconductor material is removed from the first portion of the first semiconductor layer, wherein the first conductivity in-situ doped first semiconductor material remains on the second portion of the first semiconductor layer. A second conductivity in-situ doped second semiconductor material is formed on the first portion of the first semiconductor layer, wherein the mask prohibits the second conductivity in-situ doped semiconductor material from being formed overlying the second portion of the first semiconductor layer. The dopant from the second conductivity in-situ doped second semiconductor material and the first conductivity in-situ doped first semiconductor material is then diffused into the first semiconductor layer to form extension regions.

In another embodiment, a method of fabricating an electronic structure is provided that includes providing a semiconductor on insulator (SOI) substrate including an SOI semiconductor layer having a thickness of less than 10.0 nm. A first conductivity doped first semiconductor material is formed on exposed surfaces of the first portion of the SOI semiconductor layer, and on exposed surfaces of the second portion of the SOI semiconductor layer. A mask is formed overlying the second portion of the SOI semiconductor layer. The first conductivity in-situ doped first semiconductor material is removed from the first portion of the SOI semiconductor layer, wherein the first conductivity in-situ doped first semiconductor material remains on the second portion of SOI semiconductor layer. A second conductivity in-situ doped second semiconductor material is formed on the first portion of the SOI semiconductor layer, wherein the mask prohibits the second conductivity in-situ doped second semiconductor material from being formed overlying the second portion of the SOI semiconductor layer. The dopant from the second conductivity in-situ doped second semiconductor material and the first conductivity in-situ doped first semiconductor material is then diffused into the first semiconductor layer to form dopant regions.

In another aspect, a CMOS semiconductor device is provided that includes a substrate having a layer of silicon containing material atop an insulating layer, wherein the layer of silicon containing material has at thickness of less than 10.0 nm. The CMOS semiconductor device further includes a p-type conductivity device that is present in a second device region of the substrate. The p-type conductivity device includes p-type doped SiGe raised source and drain regions that are present atop the layer of silicon containing material, and p-type extension diffusions extending from the p-type doped SiGe raised source and drain regions into the silicon-containing semiconductor layer. The CMOS semiconductor device further includes an n-type conductivity device that is present in a first device region of the substrate. The n-type conductivity device includes n-type doped Si:C raised source and drain regions present atop the layer of silicon containing material, and n-type extension diffusions extending from the n-type doped Si:C raised source and drain regions into the silicon-containing semiconductor layer.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "conductivity type" denotes a dopant region being p-type or n-type.

As used herein, "p-type" refers to the addition of impurities to an intrinsic semiconductor that creates deficiencies of valence electrons. In a silicon containing substrate, examples of n-type dopants, i.e., impurities, include but are not limited to boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

A "gate structure" means a structure used to control output current (i.e., flow of carriers in the channel) of a semiconducting device through electrical or magnetic fields.

As used herein, the term "channel" is the region underlying the gate structure and between the source and drain of a semiconductor device that becomes conductive when the semiconductor device is turned on.

As used herein, the term "drain" means a doped region in semiconductor device located at the end of the channel, in which carriers are flowing out of the transistor through the drain.

As used herein, the term "source" is a doped region in the semiconductor device, in which majority carriers are flowing into the channel.

"Epitaxial growth and/or deposition" means the growth of a semiconductor material on a deposition surface of a semiconductor material, in which the semiconductor material being grown has the same crystalline characteristics as the semiconductor material of the deposition surface.

The term "Si:C" or "carbon-doped silicon" as used herein refers to silicon having substitutional carbon atoms located therein. The substitutional carbon atoms and the silicon atoms form a silicon-carbon alloy, which is a semiconductor material.

As used herein, the terms "insulating" and "dielectric" denote a material having a room temperature conductivity of less than $10^{-10} (\Omega\text{-m})^{-1}$.

The term "direct physical contact" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element.

In one embodiment, the present invention provides a method and structure for forming extremely thin semiconductor on insulator (ETSOI) complementary metal oxide semiconductor (CMOS) devices with a reduced number of masking steps. An extremely thin semiconductor on insulator (ETSOI) complementary metal oxide semiconductor (CMOS) device is a device that is formed on a SOI substrate, in which the SOI layer has a thickness of less than 10 nm and is therefore extremely thin. Because of the extremely thin semiconductor on insulator layer, i.e., less than 10 nm, of the ETSOI devices, a major challenge of manufacturing ETSOI devices is to reduce thinning of the SOI layer, which may be the result of silicon loss from multiple photolithography and etching processes. CMOS processing typically involves multiple steps of masking, etching and ion implantation. For example, NFET regions need to be covered by a resist when ion implantation is performed in exposed PFET regions, wherein following ion implantation of the exposed PFET regions the resist is chemically stripped. Similar processes are repeated when ion implanting the NFET regions. The resist strip process results in silicon loss. Another major challenge of manufacturing ETSOI devices is to avoid damage of the thin SOI layer. Conventional ion implantation that is used to form the source and drain regions and the extension regions of the FET device turns to amorphize the entire thin SOI layer. The amorphized SOI layer needs to be recrystallized in order to achieve good device characteristics. However, it is extremely difficult, if not impossible, to recrystallize the fully amorphized thin SOI layer without a high temperature anneal process. Unfortunately, a high temperature anneal process causes excessive dopant diffusion and therefore is incompatible with the state-of-the-art CMOS technology.

The present method in one embodiment forms an ETSOI CMOS device using a single photoresist mask and introduces dopants to the extension regions by diffusion from epitaxially formed raised source and drain regions. This aspect of the present invention will now be discussed in greater detail referring to the drawings accompanying the present application. In the accompanying drawings, like and/or corresponding elements are referred to by like reference numbers.

Figure 1:
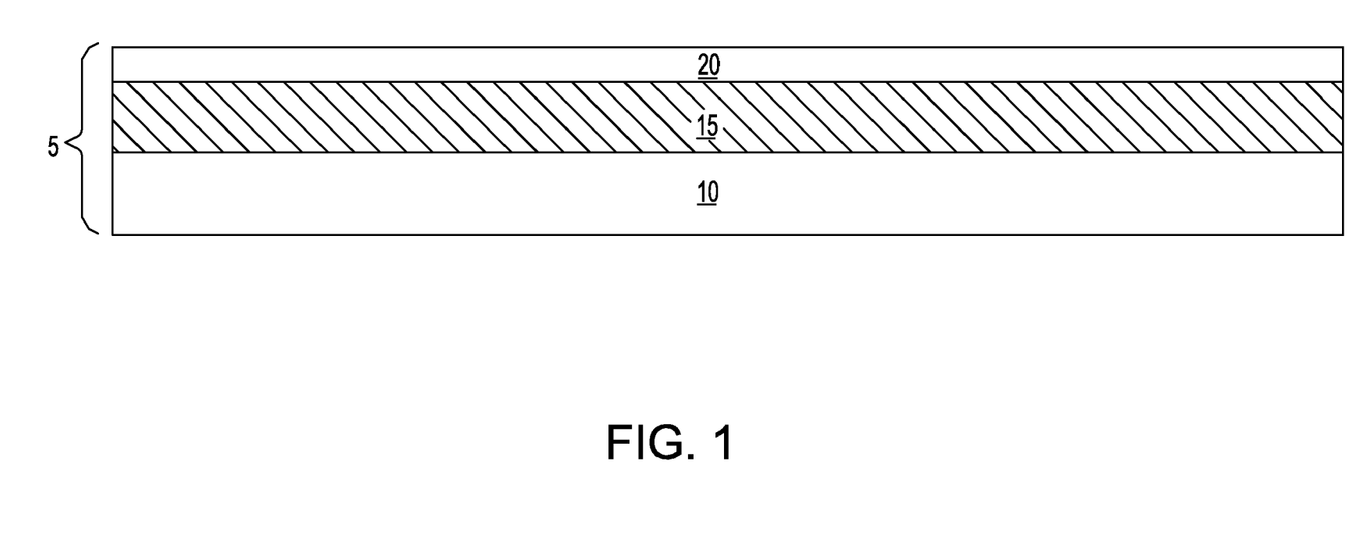
FIG. 1 is a side cross-sectional view depicting one embodiment of a semiconductor substrate, i.e., semiconductor on insulator (SOI) substrate, including at least a first semiconductor layer overlying an insulating layer, as used in accordance with the present invention.

FIG. 1 illustrates the results of the initial processing steps that produce a substrate 5, i.e., semiconductor on insulator (SOI) substrate, in which a substrate 5 comprises at least a first semiconductor layer 20 (hereafter referred to as an SOI layer 20) overlying a dielectric layer 15, wherein the SOI layer 20 has a thickness of less than 10 nm. A second semiconductor layer 10 may be present underlying the dielectric layer 15.

The SOI layer 20 may comprise any semiconducting material including, but not limited to Si, strained Si, SiC, SiGe, SiGeC, Si alloys, Ge, Ge alloys, GaAs, InAs, and InP, or any combination of substrates or crystal orientations of the above mentioned substrates. The SOI layer 20 may be thinned to a desired thickness by planarization, grinding, wet etch, dry etch, oxidation followed by wet etch, or any combination thereof. One method of thinning the SOI layer 20 is to oxidize the Si by a thermal dry or wet oxidation process, and then wet etch the oxide layer using a hydrofluoric acid mixture. This process can be repeated to achieve the desired thickness. In one embodiment, the SOI layer 20 has a thickness has a thickness ranging from 1.0 nm to 10.0 nm. In another embodiment, the SOI layer 20 has a thickness has a thickness ranging from 3.0 nm to 8.0 nm. The second semiconductor layer 10 may be a semiconducting material including, but not limited to: Si, strained Si, SiC, SiGe, SiGeC, Si alloys, Ge, Ge alloys, GaAs, InAs, InP as well as other III/V and II/VT compound semiconductors.

The insulating layer 15 that can be present underlying the SOI layer 20 and atop the second semiconductor layer 10 may be formed by implanting a high-energy dopant into the substrate 5 and then annealing the structure to form a buried oxide layer, i.e., insulating layer 15. In another embodiment, the insulating layer 15 may be deposited or grown prior to the formation of the SOI layer 20. In yet another embodiment, the substrate 5 may be formed using wafer-bonding techniques, where a bonded wafer pair is formed utilizing glue, adhesive polymer, or direct bonding.

Figure 2:
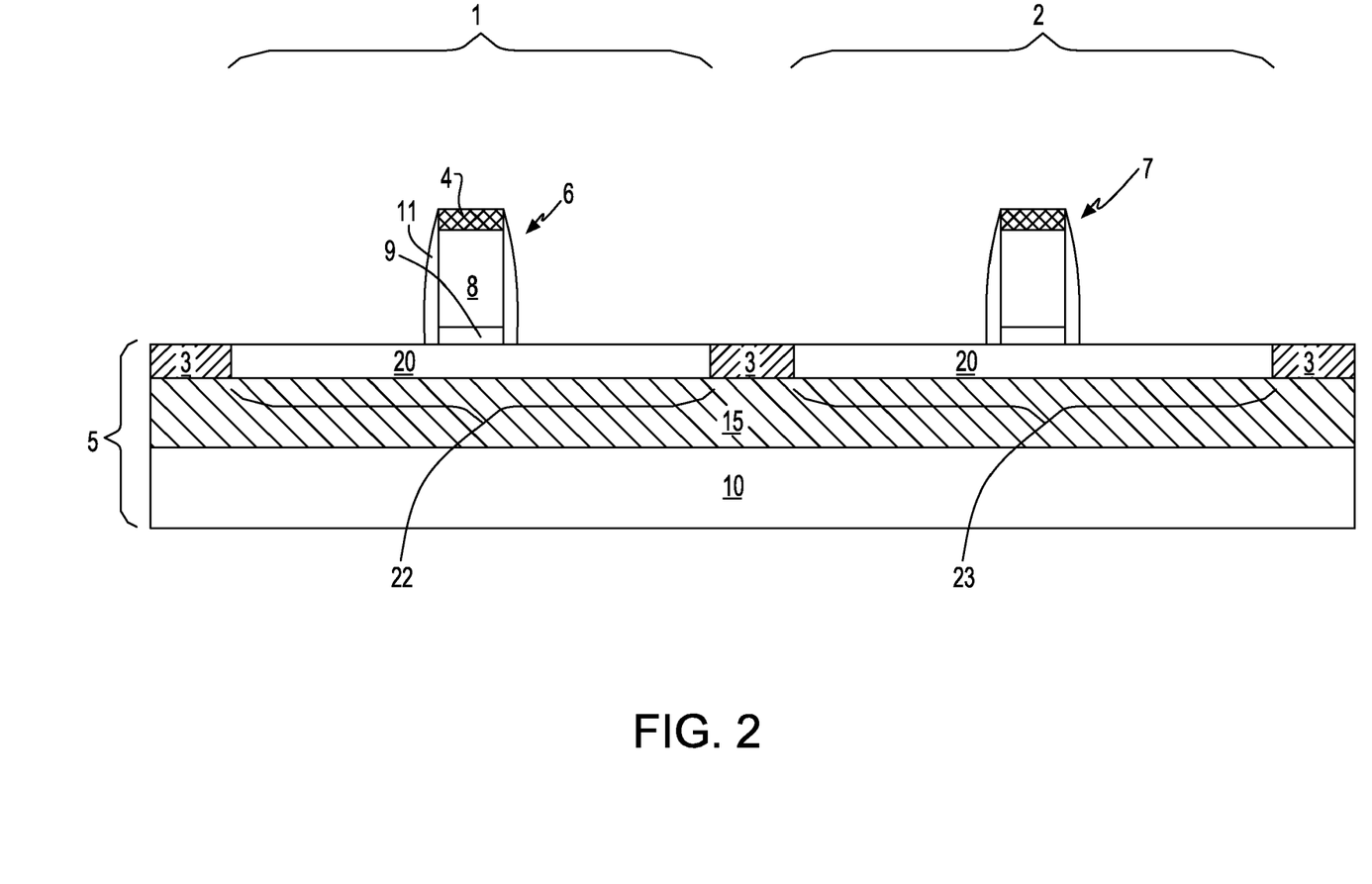
FIG. 2 is a side cross-sectional view depicting forming a first gate structure directly on a first portion of the first semiconductor layer and a second gate structure directly on a second portion of the first semiconductor layer, in accordance with one embodiment of the present invention.

Referring to FIG. 2, the substrate 5 may further include a first device region 1 and a second device region 2 separated by an isolation region 3, where a first gate structure 6 is positioned in the first device region 1 of the substrate 5 and a second gate structure 7 is positioned in the second device region 2 of the substrate 5. First device region 1 may also be referred to as an N-type device region or P-type device region, while second region 2 may also be referred to as a P-type device region or N-type device region, in which the first device region 1 has a different conductivity than the second device region 2. The isolation region 3 separates the device regions 1, 2 of the SOI layer 20 and is in direct physical contact with an upper surface of the insulating layer 15 or extends into insulating layer 15. Etching the SOI layer 20 and depositing insulative material within the etched portion of the SOI layer 20 may form the isolation region 3. The isolation region 3 may be composed of the same material as the insulative layer 15. The positioning of the isolation region 3 may define first portion 22 and the second portion 23 of the SOI layer 20.

The first and second gate structures 6, 7 can be formed using deposition, photolithography and selective etching process. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. In one embodiment, a hardmask (hereafter referred to as a dielectric cap 4) may be used to form the first and second gate structures 6, 7. The dielectric cap 4 may be formed by first depositing a dielectric hard mask material, like SiN or $SiO_2$, atop a layer of gate electrode material and then applying a photoresist pattern to the hardmask material using a lithography process steps. The photoresist pattern is then transferred into the hardmask material using a dry etch process forming the dielectric cap 4. Next the photoresist pattern is removed and the dielectric cap 4 pattern is then transferred into the gate electrode material during a selective etching process. The dielectric cap 4 may be removed by a wet or dry etch prior to the silicidation process. Alternatively, the first and second gate structures 6, 7 can be formed by other patterning techniques, such as spacer image transfer.

The first and second gate structures 6, 7 each include at least a gate conductor 8 atop a gate dielectric 9. Gate conductor 8 material is preferably polysilicon, but may also be comprised of elemental metals, metal alloys, metal silicides, and/or other conductive materials. Gate dielectric 9 may be a dielectric material, such as silicon oxide ($SiO_2$), silicon nitride, oxynitride, or alternatively high-k dielectrics, such as oxides of Ta, Zr, Al or combinations thereof. In another embodiment, the gate dielectric 9 is comprised of an oxide, such as $SiO_2$, $ZrO_2$, $Ta_2O_5$ or $Al_2O_3$. In one embodiment, the gate dielectric 9 has a thickness ranging from 1 nm to 10 nm. In another embodiment, the gate dielectric 9 has a thickness ranging from 1.5 nm to 2.5 nm.

A set of first spacers 11 may be formed in direct contact with the sidewalls of the first gate structure 6 and second gate structure 7. The first spacers 11 are typically narrow having a width ranging from 2.0 nm to 15.0 nm. The first spacer 11 may be formed using deposition and etch processing steps. The first spacer 11 may be composed of a dielectric, such as nitride, oxide, oxynitride, or a combination thereof. The thickness of the first spacer 11 determines the proximity of the subsequently formed raised source/drain (RSD) regions to the channel of the device.

Figure 3:
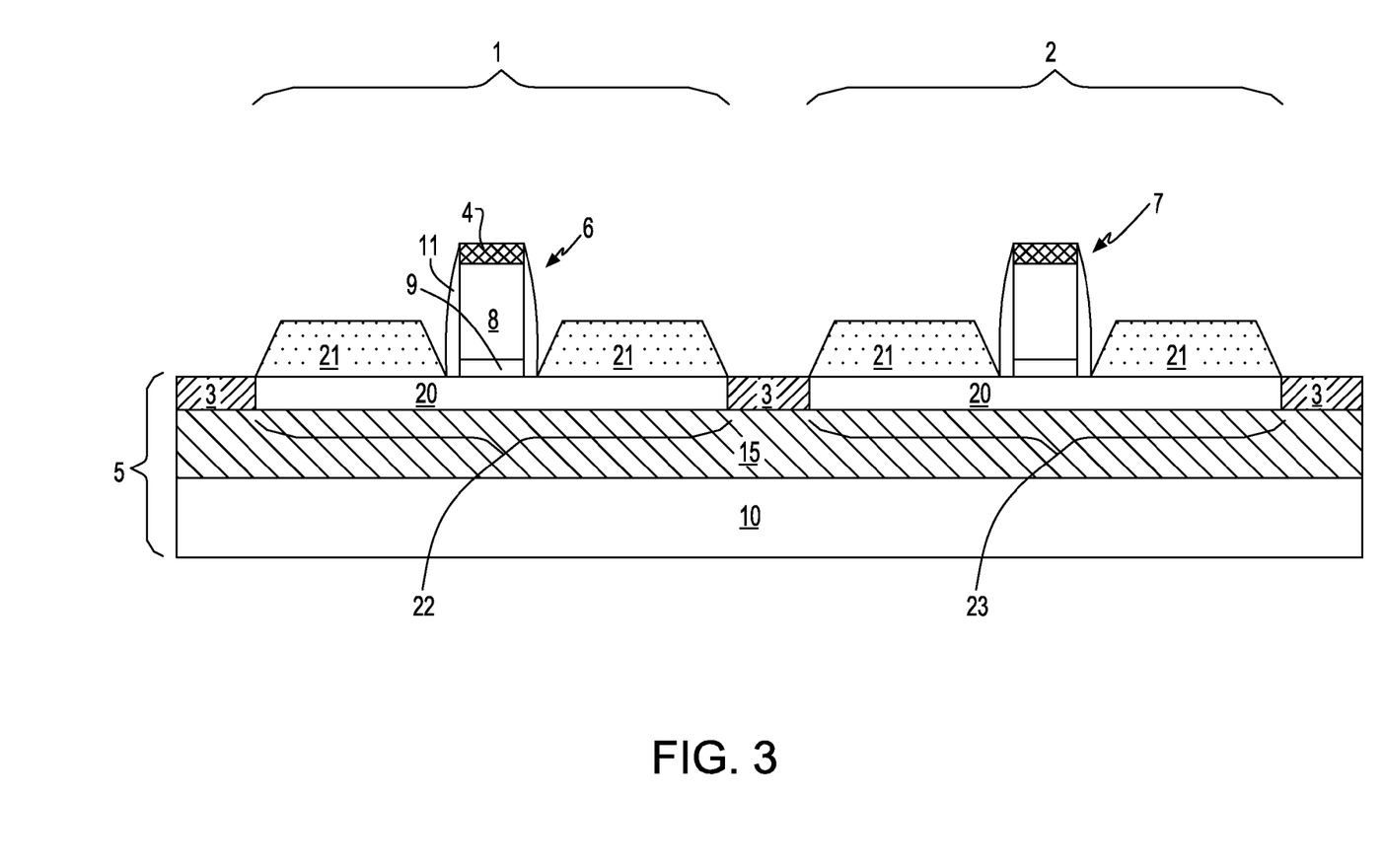
FIG. 3 is a side cross-sectional view depicting forming a first conductivity in-situ doped first semiconductor material on exposed surfaces of the first portion of the first semiconductor layer adjacent to the first gate structure, and on exposed surfaces of the second portion of the first semiconductor layer adjacent to the second gate structure, in accordance with one embodiment of the present invention.

FIG. 3 depicts one embodiment of forming a first conductivity in-situ doped first semiconductor material 21 on exposed surfaces of the first portion 22 of the SOI layer 20 adjacent to the first gate structure 6, and on exposed surfaces of the second portion 23 of the SOI layer 20 adjacent to the second gate structure 7. In one example, the first conductivity in-situ doped first semiconductor material 21 is formed simultaneously on the first portion 22 and the second portion 23 of the SOI layer 20 without utilizing a mask, such as a photoresist mask. When the chemical reactants are controlled and the system parameters set correctly, the depositing atoms arrive at the wafer surface with sufficient energy to move around on the surface and orient themselves to the crystal arrangement of the atoms of the deposition surface. Thus, an epitaxial film deposited on a {100} crystal surface will take on a {100} orientation. It on the other hand, the wafer surface has an amorphous surface layer, possibly the result of implanting, the depositing atoms have no surface to align to, resulting in the formation of polysilicon instead of single crystal silicon. A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 550° C. to 900° C.

Although higher temperature typically results in faster deposition, the faster deposition may result in crystal defects and film cracking.

In one embodiment, the first conductivity in-situ doped first semiconductor material 21 may be provided by selective-epitaxial growth of SiGe atop the SOI layer 20. The Ge content of the epitaxial grown SiGe may range from 5% to 70%, by atomic weight %. In another embodiment, the Ge content of the epitaxial grown SiGe may range from 10% to 40%.

The epitaxial grown SiGe may be under an intrinsic compressive strain, in which the compressive strain is produced by a lattice mismatch between the larger lattice dimension of the SiGe and the smaller lattice dimension of the layer on which the SiGe is epitaxially grown. In one embodiment, the epitaxial grown SiGe produces a compressive strain in the second portion 23 of the SOI layer 20 in the second device region 2, in which the channel of a semiconductor device, such as a pFET device, is subsequently formed.

In one embodiment, the first conductivity in-situ doped first semiconductor material 21 is doped with a first conductivity type dopant during the epitaxial growth process. In one embodiment, the first conductivity in-situ doped first semiconductor material 21 provides the raised source and drain regions of a semiconductor device in the second device region 2. P-type MOSFET devices are produced by doping the first conductivity in-situ doped first semiconductor material 21 with elements from group III of the Periodic Table of Elements. In one embodiment, the group III element is boron, aluminum, gallium or indium. In one example, in which the first conductivity in-situ doped first semiconductor material 21 is doped to provide a p-type conductivity, the dopant may be boron present in a concentration ranging from $1\times10^{18}$ atoms/cm$^3$ to $2\times10^{21}$ atoms/cm$^3$. In one example, the first conductivity in-situ doped first semiconductor material 21 is composed of SiGe and is doped with boron to provide the raised source and drain regions of a p-type conductivity field effect transistor that is present in the second device region 2 of the substrate 5.

Figure 4:
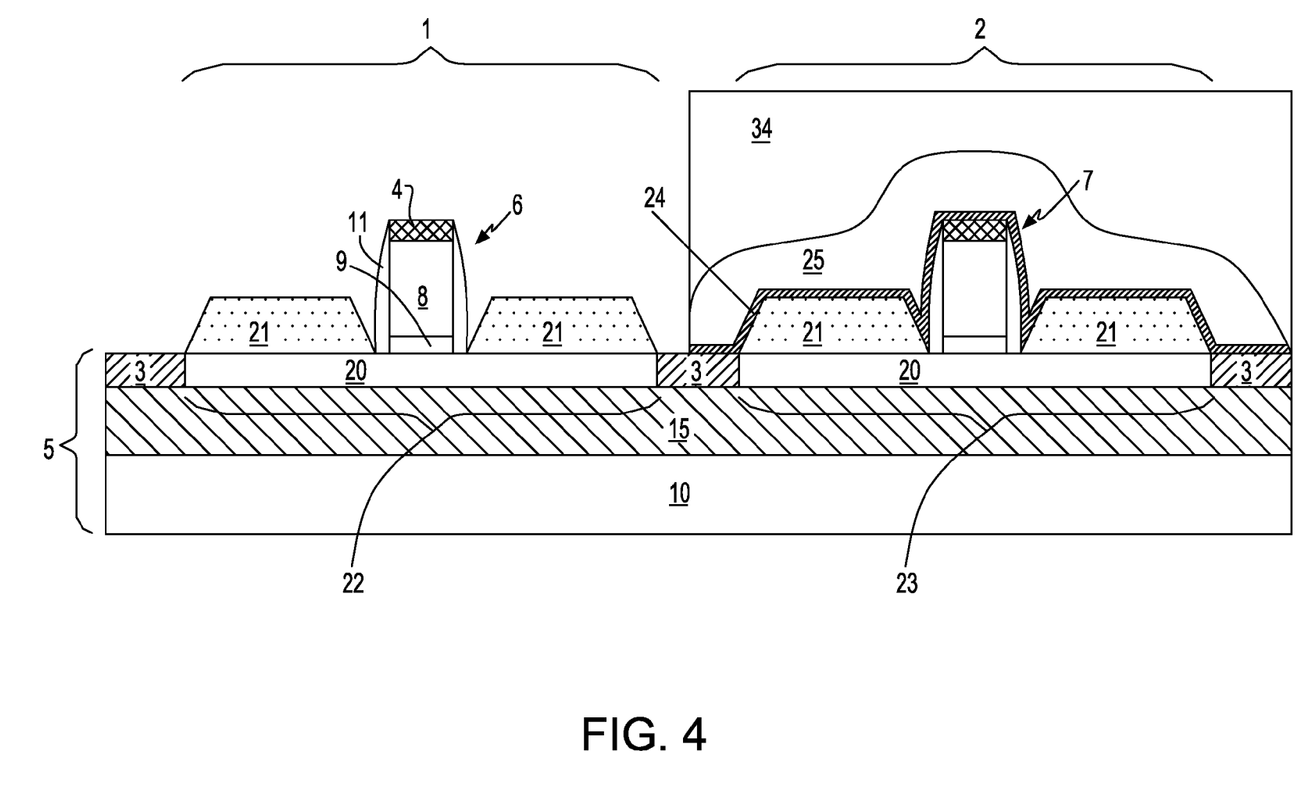
FIG. 4 is a side cross-sectional view depicting forming a mask atop the second portion of the first semiconductor layer leaving the first conductivity in-situ doped first semiconductor material on the first portion of the first semiconductor layer exposed, in accordance with one embodiment of the present invention.

FIG. 4 depicts forming a mask 24, 25, 34 overlying the second portion 23 of the SOI layer 20 leaving a first portion 22 of the SOI layer 20 exposed. The forming of the mask may include forming a dielectric layer stack. In one embodiment, the dielectric layer stack includes a first dielectric layer 24 and a second dielectric layer 25. The first dielectric layer 24 may be deposited over the first conductivity in-situ doped first semiconductor material 21 that is present on the first portion 22 of the SOI layer 20 and on the second portion 23 of the SOI layer, as well as the first and second gate structures 6, 7. In another embodiment, the dielectric layer stack includes a single dielectric layer such as dielectric layer 25.

The first dielectric layer 24 may be composed of any dielectric layer including, but not limited to oxides, nitrides, oxynitrides or combinations and multi-layers thereof. In one embodiment, the first dielectric layer 24 is composed of silicon oxide. The second dielectric layer 25 may be deposited over the first dielectric layer 24. The second dielectric layer 25 may be composed of any dielectric layer including, but not limited to: oxides, nitrides, oxynitrides or combinations and multi-layers thereof. In one embodiment, the second dielectric layer 25 is composed of silicon nitride. The first dielectric layer 24 and the second dielectric layer 25 may be formed by various deposition methods including, but not limited to spinning from solution, spraying from solution, chemical vapor deposition (CVD), plasma enhanced CVD (PECVD), plasma oxidation, plasma nitridation, sputter deposition, reactive sputter deposition, ion-beam deposition, and evaporation.

Still referring to FIG. 4, following the formation of the dielectric stack, a photoresist mask 34 is formed on the dielectric stack overlying the second portion 23 of the SOI layer 20. The photoresist mask 34 is formed atop the second device region 2 by photolithography steps. More specifically, a layer of photoresist material is deposited atop the entire structure. The photoresist material comprises of dielectrics including carbon, oxygen, and various inorganic materials. The photoresist layer is then selectively exposed to light and developed to pattern a block mask, protecting at least one region, e.g., second device region 2, of the substrate 5 and exposing at least another region, e.g., first device region 1, of the substrate 5. The exposed regions of the device are then processed while the regions underlying the photoresist mask 34 are protected. Specifically, the first dielectric layer 24 and the second dielectric layer 25 are removed from the second device region 2 of the substrate 5 using an etching process, in which the etch chemistry removes the second dielectric layer 25 selective to at least the photoresist mask 34. In one embodiment, the photoresist mask 34 may then be removed by a chemical stripping process. In another embodiment, the photoresist mask 34 may be removed by the subsequent etch process that removes the first conductivity in-situ doped first semiconductor material 21 from the first portion 22 of the SOI layer 20, or the photoresist mask 34 may be removed after the etch process that removes the first conductivity in-situ doped first semiconductor material 21 from the first portion 22 of the SOI layer 20.

Figure 5:
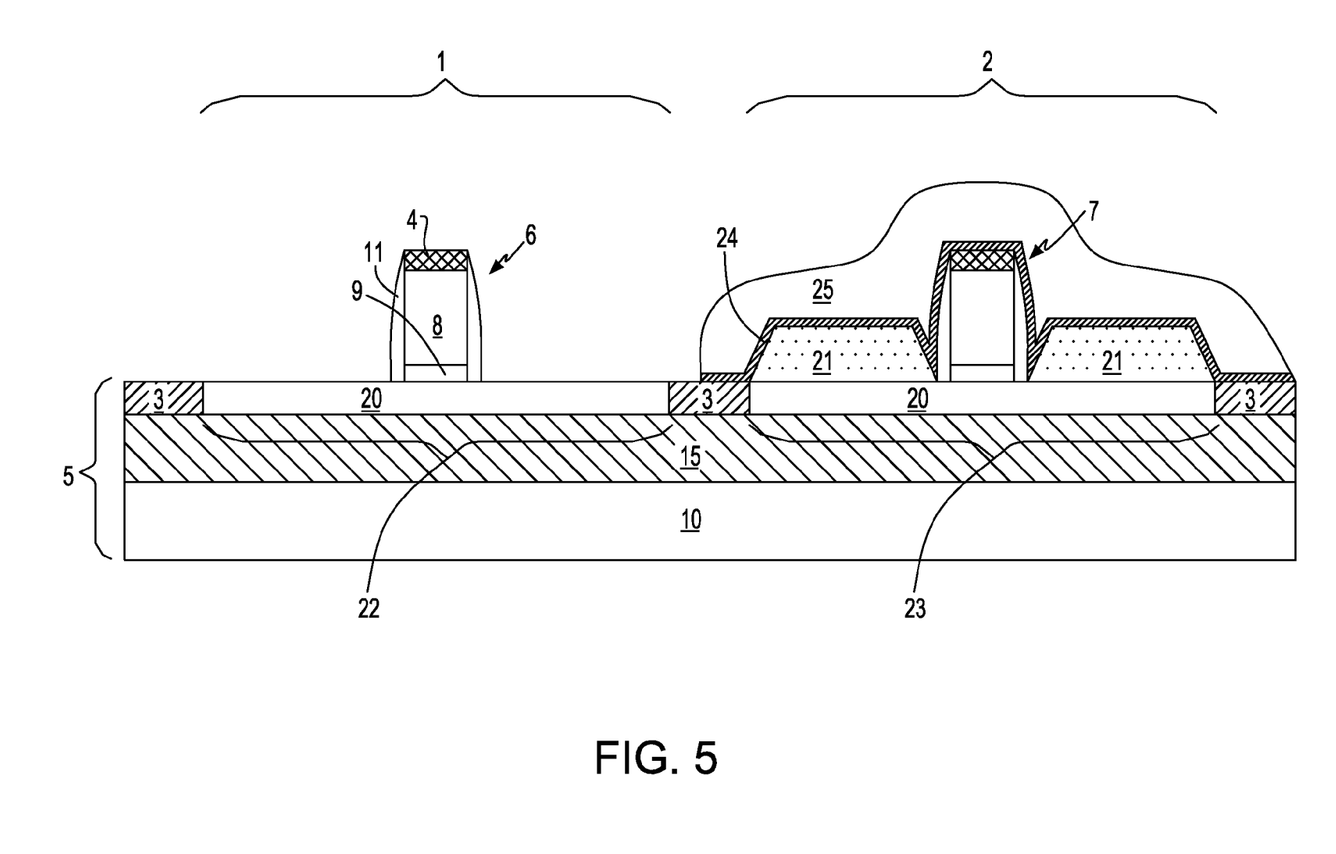
FIG. 5 is a side cross-sectional view depicting one embodiment of removing the first conductivity in-situ doped first semiconductor material from the first portion of the first semiconductor layer, wherein the first conductivity in-situ doped first semiconductor material remains on the second portion of the first semiconductor layer.

FIG. 5 depicts one embodiment of removing the first conductivity in-situ doped first semiconductor material 21 from the first portion 22 of the SOI layer 20, wherein the first conductivity in-situ doped first semiconductor material 21 remains on the second portion 23 of the SOI layer 20. In one embodiment, the first conductivity in-situ doped semiconductor material from the first portion 22 of the SOI layer 20 is removed using an etch process. For example, the first conductivity in-situ doped first semiconductor material 21 may be removed by a wet etch having an etch selectivity for removing the first conductivity in-situ doped first semiconductor material 21 selective to the second dielectric layer 25 or photoresist mask (when present); the SOI layer 20; and the elements of the first gate structure 6. In another example, the etch process may be provided by an anisotropic etch process, such as reactive ion etch (RIE). In the embodiments in which the photoresist mask is present during the etch process for removing the first conductivity in-situ doped first semiconductor material 21, the etch process may also remove the photoresist mask. In another embodiment, the photoresist mask is removed after the etch process for removing the first conductivity in-situ doped first semiconductor material 21 by a chemical stripping process. Once the first conductivity in-situ doped first semiconductor material 21 is removed, the upper surface of the first portion 22 of the SOI layer 20 is exposed.

Figure 6:
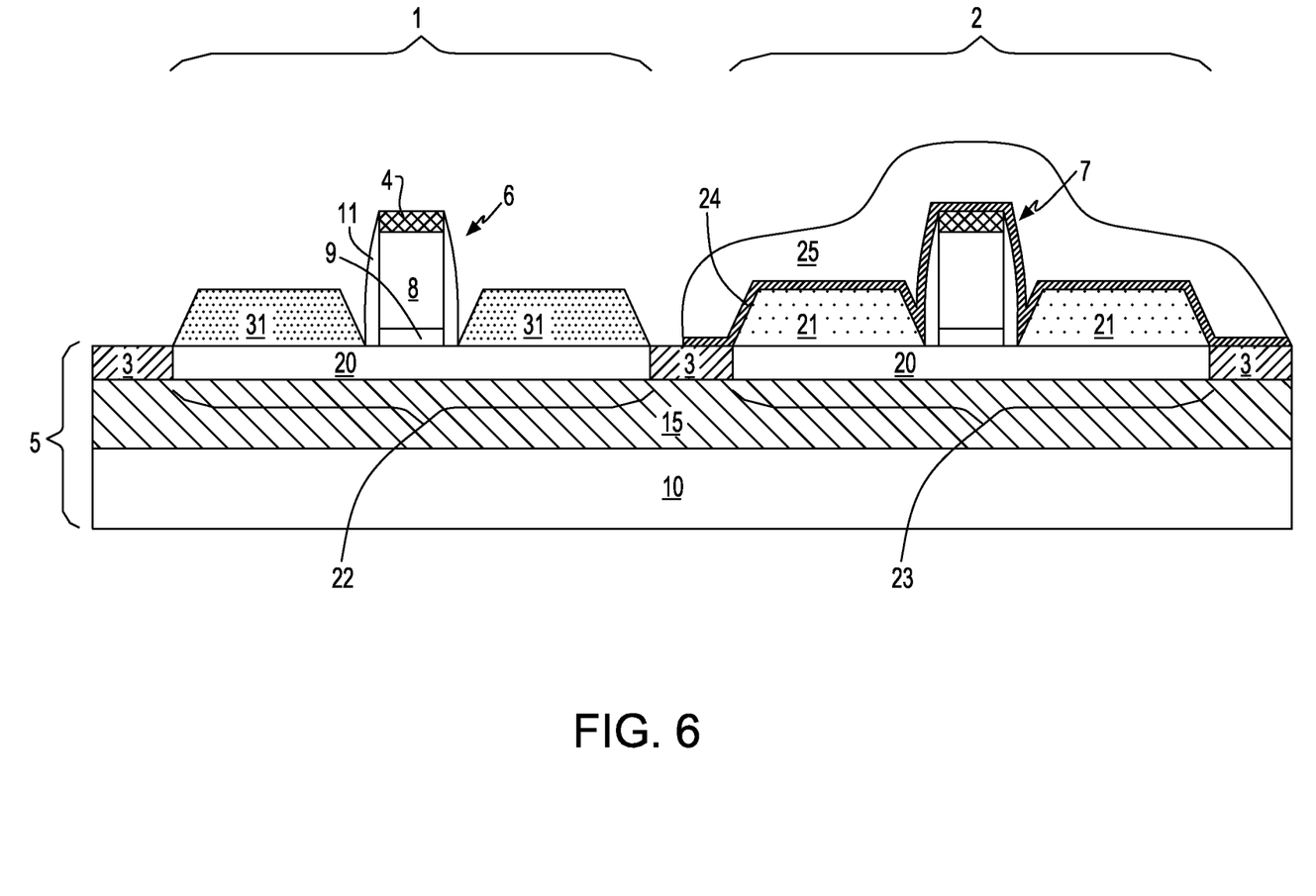
FIG. 6 is a side cross-sectional view depicting one embodiment of forming a second conductivity in-situ doped second semiconductor material on the first portion of the first semiconductor layer, in accordance with one embodiment of the present invention.

FIG. 6 depicts one embodiment of forming a second conductivity in-situ doped second semiconductor material 31 on the first portion 22 of the first semiconductor layer 20. The second conductivity in-situ doped second semiconductor material 31 is typically formed using an epitaxial growth process of a silicon containing material. The second semiconductor material of the second conductivity in-situ doped second semiconductor material 31 may be different than the first semiconductor material of the first conductivity in-situ doped first semiconductor material 21. In one embodiment, the second conductivity in-situ doped second semiconductor material 31 is composed of Si:C or carbon doped silicon. The carbon (C) content of the epitaxial grown Si:C ranges from 0.3% to 10%, by atomic weight %. In another embodiment, the carbon (C) content of the epitaxial grown Si:C may range from 1% to 2%.

The epitaxial grown Si:C may be under an intrinsic tensile strain, in which the tensile strain is produced by a lattice mismatch between the smaller lattice dimension of the Si:C and the larger lattice dimension of the layer on which the Si:C is epitaxially grown. In one embodiment, the epitaxial grown Si:C produces a tensile strain in the first portion 22 of the SOI layer 20 in the first device region 1, in which the channel of a semiconductor device, such as a nFET device, is subsequently formed.

In one embodiment, the second conductivity in-situ doped second semiconductor material 31 is doped with a second conductivity type dopant during the epitaxial growth process. In one embodiment, the second conductivity in-situ doped second semiconductor material 31 provides the raised source and drain regions of a semiconductor device in first device region 1. N-type MOSFET devices are produced within the first device region 1, by doping the second conductivity in-situ doped second semiconductor material 31 with elements from group V of the Periodic Table of Elements. In one embodiment, the group V element is phosphorus, antimony, or arsenic.

The second conductivity in-situ doped second semiconductor material 31 is not formed on the second dielectric layer 25 that is present in the second device region 2 of the substrate 5 because of the selective nature of the epitaxial deposition process. The fact that the process is selective means that the Si grows only on the exposed semiconductor regions of the SOI layer 20, and does not grow on dielectric surfaces, i.e., nitride or oxide surfaces, such as the second dielectric layer 25 and the isolation regions 3.

Figure 7:
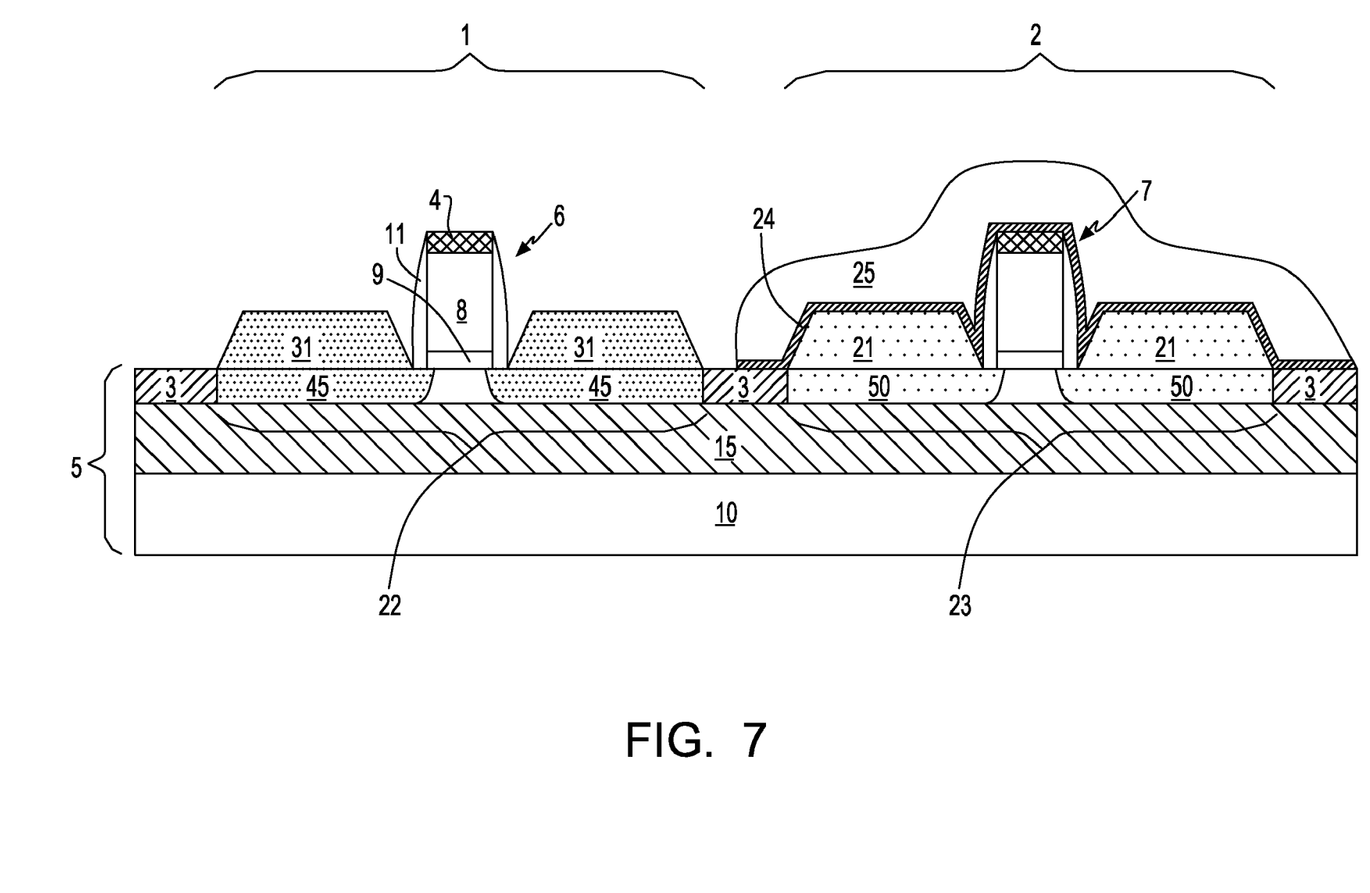
FIG. 7 is a side cross-sectional view depicting one embodiment of diffusing dopant from the second conductivity in-situ doped second semiconductor material and the first conductivity in-situ doped first semiconductor material into the first semiconductor layer to form extension regions, in accordance with one embodiment of the present invention.

FIG. 7 depicts one embodiment of diffusing dopant from the second conductivity in-situ doped second semiconductor material 31 and the first conductivity in-situ doped first semiconductor material 21 into the SOI layer 20 to form extension regions 45, 50. In one embodiment, the dopant from the second conductivity in-situ doped second semiconductor material 31 and the first conductivity in-situ doped first semiconductor material 21 is diffused into the SOI layer 20 by an annealing processes including, but not limited to rapid thermal annealing, furnace annealing, flash lamp annealing, laser annealing, or any suitable combination of thereof. In one embodiment, thermal annealing to diffuse the dopant from the second conductivity in-situ doped second semiconductor material 31 and the first conductivity in-situ doped first semiconductor material 21 into the SOI layer 20 is conducted by a rapid thermal annealing process at a temperature ranging from 850° C. to 1350° C.

In one embodiment, in which the first conductivity in-situ doped first semiconductor material 21 is doped to a p-type conductivity, the extension regions 45 that are formed in first portion 22 of the SOI layer 20 in the first device region 1 have a p-type conductivity. Typically, the dopant concentration of the extension regions 45 having the p-type conductivity ranges from $1 \times 10^{19}$ atoms/cm$^3$ to $5 \times 10^{20}$ atoms/cm$^3$. In another embodiment, the extension regions 45 having the p-type conductivity ranges from $2 \times 10^{19}$ atoms/cm$^3$ to $2 \times 10^{20}$ atoms/cm$^3$.

In one embodiment, in which the second conductivity in-situ doped second semiconductor material 31 is doped to an n-type conductivity, the extension regions 50 that are formed in second portion 23 of the SOI layer 20 in the second device region 2 have an n-type conductivity. Typically, the dopant concentration of the extension regions 50 having the n-type conductivity ranges from $1 \times 10^{19}$ atoms/cm$^3$ to $5 \times 10^{20}$ atoms/cm$^3$. In another embodiment, the extension regions 50 having the n-type conductivity ranges from $2 \times 10^{19}$ atoms/cm$^3$ to $2 \times 10^{20}$ atoms/cm$^3$.

Still referring to FIG. 7, in one embodiment, the extension regions 45, 50 have a depth that extends the entire depth of the SOI layer 20. Therefore, the extension regions 45, 50 have a depth of less than 10 nm, typically being 3 nm to 8 nm in depth, as measured from the upper surface of the SOI layer 20.

Figure 8:
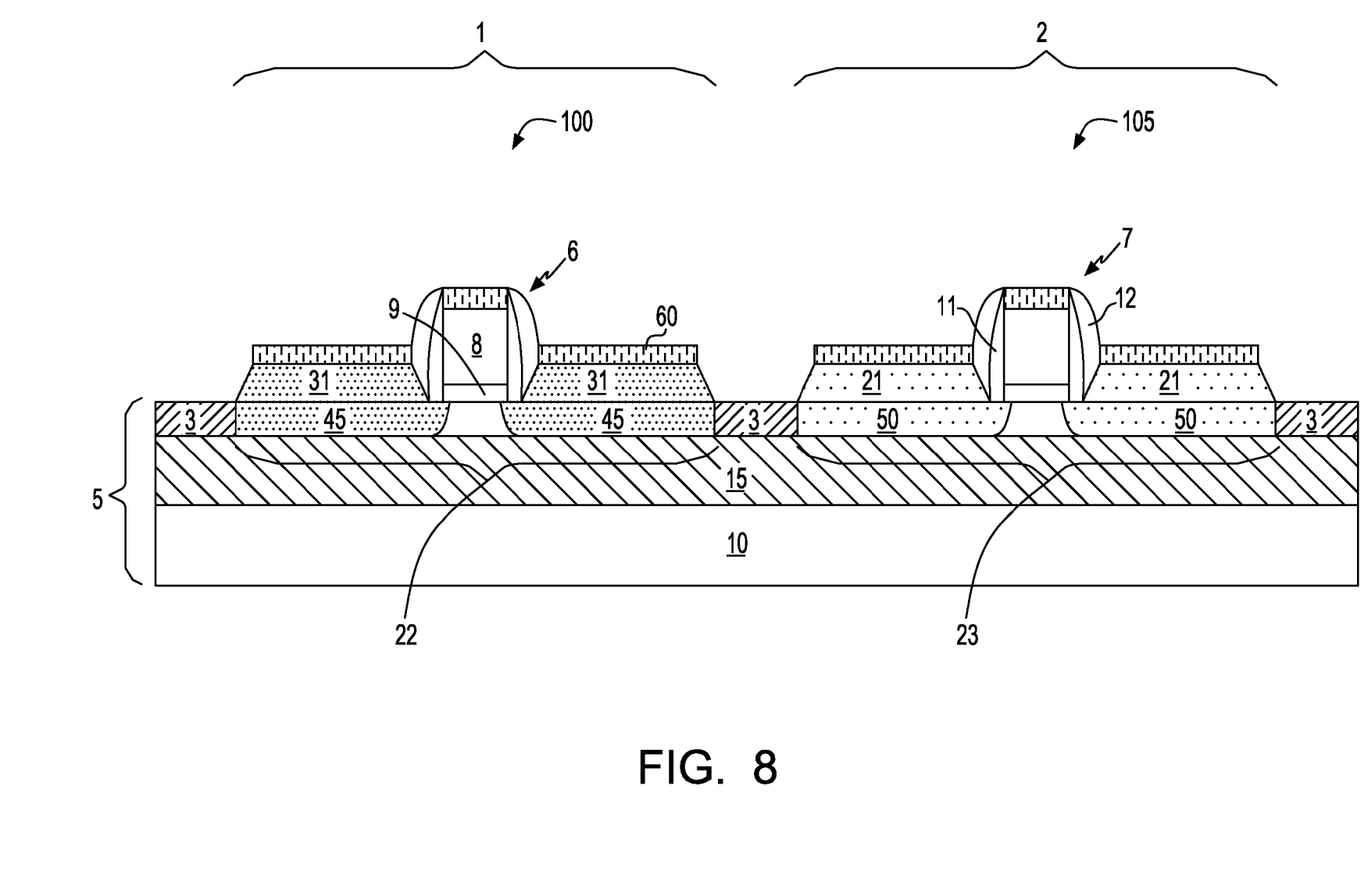
FIG. 8 is a side cross-sectional view depicting one embodiment of removing the mask and forming silicides to the raised source and drain regions of the device, in accordance with one embodiment of the present invention.

FIG. 8 depicts removing the masking layers 24, 25, and the dielectric cap 4 from the first and second gate structures 6, 7, and forming second spacers 12 in direct contact with the sidewalls of the first and second gate structures 6, 7. The width of the second spacers 12 is selected to ensure that subsequent silicidation processes do not result in a silicide bridge from the contacts to the raised source and drain regions provided by the first conductivity in-situ doped first semiconductor material 21 and the second conductivity in-situ doped second semiconductor material 31 to the gate conductor 8. The second spacers 12 may be formed by depositing a conformal dielectric film and using a highly directional dry etch process. The second spacers 12 may be composed of a dielectric such as a nitride, oxide, oxynitride, or a combination thereof.

Still referring to FIG. 8, silicides 60 are formed in the raised source and drain regions of the device, i.e., the first conductivity in-situ doped first semiconductor material 21 and the second conductivity in-situ doped second semiconductor material 31. Silicide formation typically requires depositing a refractory metal such as cobalt, nickel, or titanium onto the surface of a Si-containing material. Following deposition, the structure is then subjected to an annealing step using conventional processes such as, but not limited to, rapid thermal annealing. During thermal annealing, the deposited metal reacts with Si forming a metal silicide. The remaining unreacted metal is removed by an etch process selective to silicides 60 and spacers 12. A gate silicide may also be formed on the gate conductor.

Following silicide formation, a layer of dielectric material is blanket deposited atop the entire substrate and planarized. The blanket dielectric may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the blanket dielectric include: any of the aforementioned materials in porous form, or in a form that changes during processing to or from being porous and/or permeable to being non-porous and/or non-permeable.

The blanket dielectric may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited dielectric is then patterned and etched to form via holes to the various source/drain and gate conductor regions of the substrate. Following via formation interconnects are formed by depositing a conductive metal into the via holes using conventional processing, such as CVD or plating. The conductive metal may include, but is not limited to: tungsten, copper, aluminum, silver, gold, and alloys thereof.

Referring to FIG. 8, the above process may provide a CMOS device that in one embodiment includes a substrate 5 having a layer of silicon containing material (SOI layer 20) atop an insulating layer 15, wherein the layer of silicon containing material has at thickness of less than 10.0 nm. The first device region 1 of the substrate 5 may include an n-type conductivity device 100, in which the n-type conductivity device 100 includes n-type doped Si:C raised source and drain regions (second conductivity in-situ doped second semiconductor material 31) present atop the layer of silicon containing material and n-type extension diffusions (extension regions 45) extending from the n-type doped Si:C raised source and drain regions into the layer of silicon containing material. The second device region 2 of the substrate 5 may include a p-type conductivity device 105, in which the p-type conductivity device 105 includes p-type doped SiCe raised source and drain regions (first conductivity in-situ doped second semiconductor material 21) present atop the layer of silicon containing material and p-type extension diffusions (extension regions 50) extending from the p-type doped SiGe raised source and drain regions into the silicon containing semiconductor layer. Although, the above description and Figures depict a MOSFET, other semiconductor structures have been contemplated for the present method including, but not limited to FinFET, multiple gate MOSFET, and/or nanowire structures.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor device comprising:
   providing a substrate comprising at least a first semiconductor layer overlying a dielectric layer, wherein the first semiconductor layer has a thickness of less than 10 nm; forming a first gate structure directly on a first portion of the first semiconductor layer and a second gate structure directly on a second portion of the first semiconductor layer;
   forming a first conductivity in-situ doped first semiconductor material on exposed surfaces of the first portion of the first semiconductor layer adjacent to the first gate structure, and on exposed surfaces of the second portion of the first semiconductor layer adjacent to the second gate structure;
   forming a mask atop the second portion of the first semiconductor layer leaving the first conductivity in-situ doped first semiconductor material on the first portion of the first semiconductor layer exposed;
   removing the first conductivity in-situ doped first semiconductor material from the first portion of the first semiconductor layer, wherein the first conductivity in-situ doped first semiconductor material remains on the second portion of the first semiconductor layer; forming a second conductivity in-situ doped second semiconductor material on the first portion of the first semiconductor layer, wherein the mask prohibits the second conductivity in-situ doped semiconductor material from being formed atop the second portion of the second semiconductor layer; and
   diffusing dopant from the second conductivity in-situ doped second semiconductor material and the first conductivity in-situ doped first semiconductor material into the first semiconductor layer to form extension regions.

2. The method of claim 1, wherein the first portion of the first semiconductor layer is electrically isolated from the second portion of the first semiconductor layer.

3. The method of claim 1, wherein the substrate further comprising a second semiconductor layer separated from the overlying first semiconductor layer by the dielectric layer.

4. The method of claim 1, wherein the forming of the first conductivity in-situ doped first semiconductor material comprises epitaxial growth of p-type doped SiGe.

5. The method of claim 4, wherein the p-type doped SiGe comprise a dopant concentration ranging from $1 \times 10^{19}$ atoms/cm$^3$ to $5 \times 10^{20}$ atoms/cm$^3$.

6. The method of claim 5, wherein a p-type dopant of the p-type doped SiGe comprises boron, aluminum, gallium or indium.

7. The method of claim 1, wherein the forming of the mask comprises forming a dielectric stack over the first conductivity in-situ doped first semiconductor material that is present on the first portion of the first semiconductor layer and on the second portion of the first semiconductor layer; forming a second dielectric layer over the first dielectric layer, forming a photoresist mask on the dielectric stack atop the second portion of the first semiconductor layer; and etching the dielectric stack selective to the photoresist mask and the first conductivity in-situ doped first semiconductor material.

8. The method of claim 7, wherein the dielectric stack comprises an oxide present on the first portion of the first semiconductor layer and on the second portion of the first semiconductor layer, and a nitride that is present on the oxide.

9. The method of claim 1, wherein the forming of the second conductivity in-situ doped second semiconductor material on the first portion of the first semiconductor layer comprises epitaxial growth of n-type doped Si:C.

10. The method of claim 9, wherein the n-type doped Si:C comprises a dopant concentration ranging from $1 \times 10^{18}$ atoms/cm$^3$ to $2 \times 10^{21}$ atoms/cm$^3$.

11. The method of claim 5, wherein a n-type dopant of the n-type doped Si:C comprises antimony, arsenic or phosphorous.

12. The method of claim 1, wherein following forming the second conductivity in-situ doped second semiconductor material, the mask is removed by etching.

13. The method of claim 1, wherein the diffusing dopant from the second conductivity in-situ doped second semiconductor material and the first conductivity in-situ doped first semiconductor material into the first semiconductor layer comprises annealing.

14. The method of claim 13, wherein the annealing comprises rapid thermal annealing, furnace annealing, flash lamp annealing or laser annealing.

15. The method of claim 1, wherein the second conductivity in-situ doped second semiconductor material and the first conductivity in-situ doped first semiconductor material provides raised source and drain regions.

16. A method of fabricating an electronic structure comprising:
   providing a semiconductor on insulator (SOI) substrate comprising an SOI semiconductor layer having a thickness of less than 5 nm;
   forming an first conductivity doped first semiconductor material on exposed surfaces of the first portion of the SOI semiconductor layer, and on exposed surfaces of the second portion of the SOI semiconductor layer;
   forming a mask overlying the second portion of the SOI semiconductor layer; removing the first conductivity in-situ doped first semiconductor material from the first portion of the SOI semiconductor layer, wherein the first conductivity in-situ doped first semiconductor material remains on the second portion of SOI semiconductor layer;

forming a second conductivity in-situ doped second semiconductor material on the first portion of the SOI semiconductor layer, wherein a mask prohibits the second conductivity in-situ doped second semiconductor material from being formed atop the second portion of the SOI semiconductor layer; and diffusing dopant from the second conductivity in-situ doped second semiconductor material and the first conductivity in-situ doped first semiconductor material into the first semiconductor layer to form dopant regions.

17. The electric structure of claim 16, wherein the electric structure is a MOSFET, FinFET, multiple gate MOSFET, or nanowire.

* * * * *